United States Patent
Nehling et al.

(10) Patent No.: US 7,597,582 B2
(45) Date of Patent: Oct. 6, 2009

(54) BACKPLANE FOR USE IN A PUSH-IN RACK FOR PERIPHERALS

(75) Inventors: Kornelius Nehling, Bielefeld (DE); Robert Depta, Augsburg (DE)

(73) Assignee: Fujitsu Siemens Computers GmbH, Munich (DE)

( * ) Notice: Subject to any disclaimer, the term of this patent is extended or adjusted under 35 U.S.C. 154(b) by 113 days.

(21) Appl. No.: 11/769,904

(22) Filed: Jun. 28, 2007

(65) Prior Publication Data

US 2008/0003885 A1    Jan. 3, 2008

Related U.S. Application Data

(63) Continuation of application No. PCT/DE2006/001158, filed on Jul. 4, 2006.

(30) Foreign Application Priority Data

Jul. 14, 2005    (DE)    ........................ 10 2005 033 004

(51) Int. Cl.
*H01R 12/00*    (2006.01)
(52) U.S. Cl. ........................ 439/490; 361/788; 439/955
(58) Field of Classification Search ................ 439/61, 439/490, 955; 361/784, 785, 786, 788; 710/301, 710/302
See application file for complete search history.

(56) References Cited

U.S. PATENT DOCUMENTS

| | | | |
|---|---|---|---|
| 5,121,190 A * | 6/1992 | Hsiao et al. ................. 257/778 |
| 5,491,830 A | 2/1996 | Ferri | |
| 5,666,557 A | 9/1997 | Cassidy et al. | |
| 5,790,374 A * | 8/1998 | Wong ......................... 361/685 |
| 5,911,050 A * | 6/1999 | Egan et al. ................... 710/100 |
| 6,216,186 B1 | 4/2001 | Mayhead et al. | |
| 6,529,967 B1 * | 3/2003 | Robertson .................... 710/16 |
| 6,549,027 B1 | 4/2003 | Mott | |
| 6,822,841 B2 * | 11/2004 | Chang et al. ................. 361/110 |
| 7,054,976 B2 * | 5/2006 | Park ........................... 710/301 |
| 7,248,481 B2 * | 7/2007 | Trobough .................... 361/785 |
| 2003/0227728 A1 | 12/2003 | Chang et al. | |

OTHER PUBLICATIONS

Gray, Kevin, "Serial Attached SCSI: A Serial Interface for Enterprise Storage Systems", Jul. 31, 2003, Maxtor Corporation, XP002407997.

* cited by examiner

*Primary Examiner*—Neil Abrams
(74) *Attorney, Agent, or Firm*—Edell, Shapiro & Finnan, LLC

(57) ABSTRACT

A backplane for use in a push-in rack for peripherals includes slots with plug connectors that connect with peripherals which have been pushed into the push-in rack, and at least one further plug connector that connects the backplane to a control apparatus. An assigned optical signaling device is also provided for each slot. The backplane further includes a monitoring device operable to determine, for each connected peripheral, whether a peripheral is compatible with the connected control apparatus and, if the peripheral is incompatible, the monitoring device activates the respective optical signaling device assigned to the slot for the incompatible peripheral. The backplane is suitable for use in data processing apparatuses in conjunction with peripherals which are designed in accordance with the SAS (Serial Attached Small Computer System Interface) or SATA (Serial Advanced Technology Attachment) specification.

11 Claims, 2 Drawing Sheets

BACKPLANE FOR USE IN A PUSH-IN RACK FOR PERIPHERALS

CROSS REFERENCE TO RELATED APPLICATIONS

This application is a continuation of International Application No. PCT/DE2006/001158, filed on Jul. 4, 2006, entitled "Backplane for Use in a Push-In Rack for Peripherals," which claims priority under 35 U.S.C. §119 to Application No. DE 102005033004.5 filed on Jul. 14, 2005, entitled "Backplane for Use in a Push-In Rack for Peripherals," the entire contents of which are hereby incorporated by reference.

FIELD OF THE INVENTION

The invention relates to a backplane for use in a push-in rack for peripherals.

BACKGROUND

Backplanes are frequently used in modular signaling, data processing or communication devices. Peripherals, plug-in cards or other functional modules which are provided with plug-in contacts can be inserted into the push-in rack. Running transverse to the push-in direction at the rear end of the push-in compartments of the push-in rack is the backplane which contains slots having plug connectors for each push-in compartment, the plug-in contacts of the peripherals which have been pushed in interacting with the plug connectors. A further plug connector for connection to the control apparatus for the peripherals which have been pushed in is available on the backplane. The plug connectors for the devices which have been pushed in are connected to the further plug connectors for the control apparatus via the backplane, this being able to be effected using either a bus-type parallel connection or a direct connection (point-to-point connection). Mixed structures in which for example power supply lines extending between the individual plug connectors are designed to be parallel in the manner of a bus and the data line, however, designed to be direct, are also conceivable.

In the field of data processing, such backplanes are frequently used if one or more identical peripherals (e.g., hard disk drives) are provided in a housing. Network service providers, in particular, frequently use server computers having a multiplicity of hard disk drives in the form of a RAID (Redundant Array of Independent Devices) system. If one hard disk drive fails, the arrangement of the drives in a push-in rack makes it possible to exchange the defective drive in a rapid and simple manner.

A lack of compatibility between the devices to be exchanged may constitute a problem. SAS (Serial Attached Small Computer System Interface) and SATA (Serial Advanced Technology Attachment) are, for example, two specifications for a high-speed data bus with serial data transmission. Systems and devices which are operated in accordance with one of these specifications (this is indicated below by placing the appropriate abbreviation in front) are frequently operated side by side in mixed environments in the field of servers. In this case, partially identical plug connectors are first of all provided for SAS and SATA systems. The basic features of the signal specifications of the two systems are similar but they differ in certain details, for example the signal amplitudes. The data format used is likewise different.

In this case, SAS control apparatuses usually have the additional capability of being able to process signals and data formats based on the SATA specification. Such SAS/SATA control apparatuses can thus work together with both SAS peripherals and SATA peripherals, whereas SATA control apparatuses can work together only with SATA peripherals. In contrast, the combination of an SATA control apparatus with an SAS peripheral does not work or does not work reliably.

In order to avoid such combinations which are not electrically compatible, the SATA specification provides a lug on the plug connector of the peripheral and a corresponding gap on the appropriate mating part, that is to say in the plug connector of a slot on a backplane, for example. SAS and SATA peripherals can thus be used on SAS backplanes but only SATA peripherals can be used in SATA slots. Although this mechanical protection makes it possible, in principle, to prevent an incompatible combination of peripherals and control apparatuses, it is associated with some disadvantages.

On the one hand, there is the risk of plug connectors and thus also the peripherals being destroyed if the mechanical barrier is overcome by an excessive expenditure of force, which can definitely occur in practice "when things are to be done quickly". On the other hand, manufacturers of backplanes must provide them in the two versions. In addition, it must be ensured that, when operating systems, the respective version of the backplane used corresponds to the control apparatus being used. If, for example, the control apparatus is changed from SATA to SAS/SATA, the backplane must also be changed if an SAS-enabled peripheral is intended to be used. In contrast, if SAS backplanes are used, in principle, in order to circumvent this problem, there is again no protection against the incompatible combination of an SAS peripheral with an SATA control apparatus.

Particularly in the case of large systems having a large number of different servers and peripherals, for example in the case of the so-called server farms, in which very different hardware configurations are often used side by side and can also often change as a result of components being exchanged after a system failure, the mechanical solution is not suitable for protecting against inadvertently installed incompatible combinations.

SUMMARY

A backplane for use in a push-in rack for peripherals is described herein. Furthermore, described herein is a computer including a push-in rack for holding a plurality of peripherals. The backplane comprises at least one slot with plug connectors for connecting peripherals which have been pushed into the push-in rack, at least one further plug connector for connecting the backplane to at least one control apparatus. The further plug connector being connected to one or more of the plug connectors of the slots via the backplane for the purpose of interchanging signals between the control apparatus and the peripherals. The backplane further comprises a respective optical signaling device which is assigned to the at least one slot. The backplane further includes a monitoring device operable to determine, for each connected peripheral, whether a peripheral is compatible with the connected control apparatus and, if the peripheral is incompatible, the monitoring device activates the respective optical signaling device assigned to the slot for the incompatible peripheral. The backplane is suitable for use in data processing apparatuses in conjunction with peripherals which are designed in accordance with the SAS (Serial Attached Small Computer System Interface) or SATA (Serial Advanced Technology Attachment) specification.

The described backplane can be flexibly used with control apparatuses and peripherals which operate according to different specifications and, at the same time, protects against the use of incompatible combinations of control apparatus and peripheral. Likewise, the data processing apparatus (i.e., computer) in which peripherals which operate according to different specifications can be flexibly used in a push-in rack without the risk of incompatibility.

The backplane further comprises a monitoring device which is configured to determine, for each connected peripheral, whether this peripheral is electrically compatible with the control apparatus connected to it and, if it is determined that one of the peripherals is not compatible with the control apparatus connected to it, to activate the optical signaling device assigned to the slot for this peripheral. Since the monitoring device detects incompatibility, plug connectors can be used which can mechanically interact with peripherals based on different specifications. Therefore, the backplane can be used in a flexible manner. Nevertheless, the user is warned of incompatible combinations, thereby reducing the risk of undetected incompatible configurations.

The above and still further features and advantages of the present invention will become apparent upon consideration of the following definitions, descriptions and descriptive figures of specific embodiments thereof, wherein like reference numerals in the various figures are utilized to designate like components. While these descriptions go into specific details of the invention, it should be understood that variations may and do exist and would be apparent to those skilled in the art based on the descriptions herein.

BRIEF DESCRIPTION OF THE DRAWINGS

The data processing system and backplane will be explained in more detail below with reference to two exemplary embodiments which are illustrated in two figures, where.

DETAILED DESCRIPTION

Figure 1:
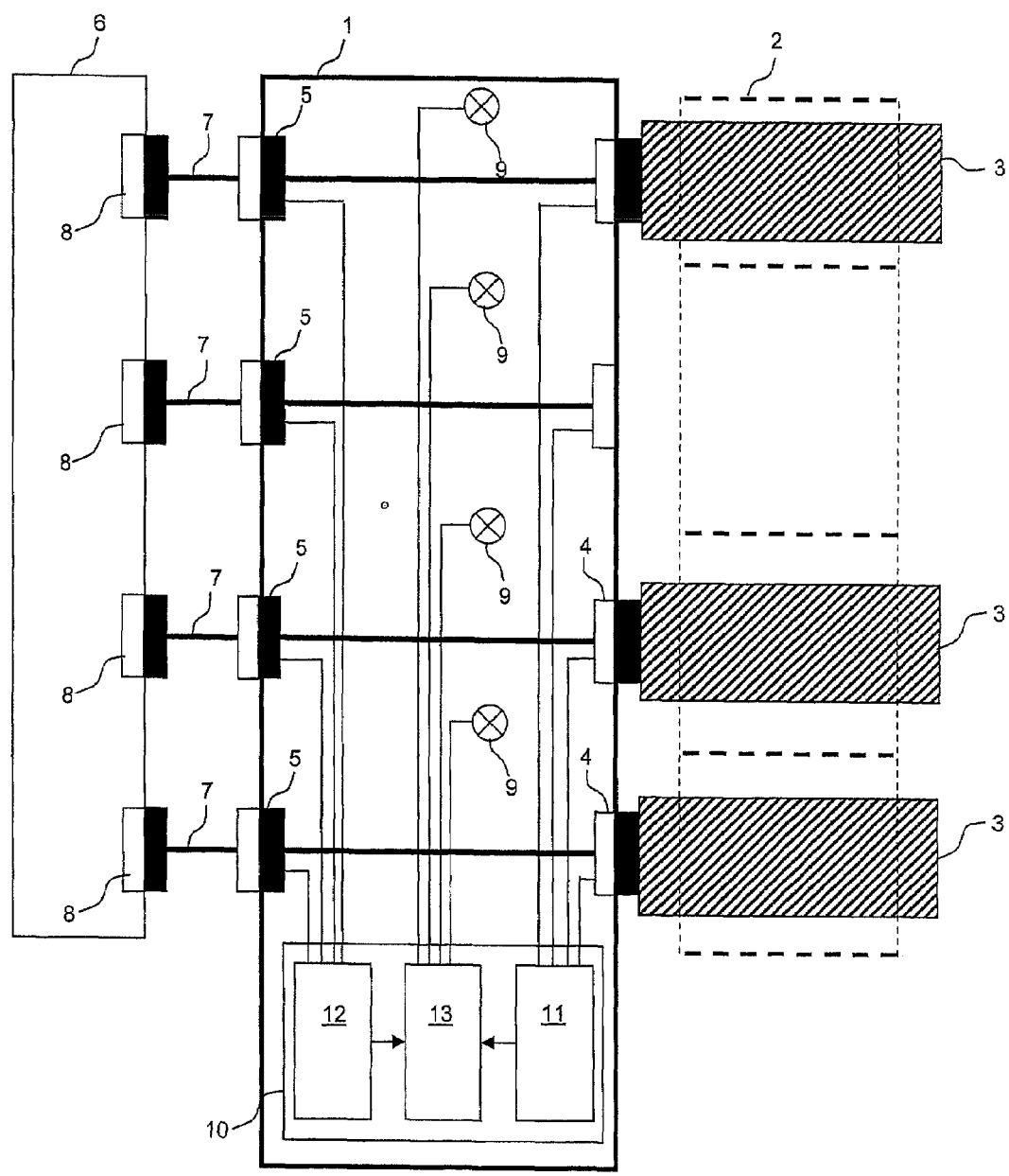
FIG. 1 shows a diagrammatic illustration of the data processing system including a first exemplary embodiment of the backplane.

FIG. 1 shows a backplane 1 which, together with a push-in rack 2 for holding peripherals 3, is part of a data processing apparatus. The backplane 1 includes plug connectors 4 configured to make contact with the peripherals 3 which have been pushed in, as well as further plug connectors 5. The further plug connectors 5 can be used to connect the backplane 1 to plug connectors 8 of a control apparatus 6 using appropriate cables 7. Optical signaling apparatuses 9 which are connected to a monitoring device 10 are also provided on the backplane 1. The monitoring device 10 comprises first detector 11 and second detector 12 which are respectively connected to the plug connectors 4 and to the further plug connectors 5. The monitoring device 10 also comprises a comparator 13 which is connected to the first and second detectors 11 and 12.

The system illustrated in FIG. 1 can be used in a data processing apparatus in which, for example, a plurality of hard disk drives are provided as peripherals 3 in a push-in rack 2. The hard disk drives can be replaced in a rapid and simple manner, if necessary, in order to achieve a high level of availability of the data processing apparatus, for example.

Such a data processing apparatus could be a computer, for example a server, or else a memory cabinet. Depending on the data processing apparatus, provision is made of further components which are not shown here for reasons of clarity. In the case of a computer, they would be, for example, a motherboard with a processor, to which the control device 6 would be connected for the purpose of interchanging data. In the case of a memory cabinet, components which could be used by the control apparatus 6 to interchange data with a network would accordingly be provided.

The backplane 1 includes a slot with a plug connector 4 for each push-in compartment of the push-in rack 2. The arrangement of these plug connectors 4 is matched to the push-in rack 2, with the result that the plug-in contacts of a peripheral which has been pushed into a push-in compartment interact with the respective plug connector 4. Four push-in compartments are shown, by way of example, in the figure, but the backplane 1 may be designed for any desired number of push-in compartments. A further plug connector 5 for connection to the control apparatus 6 is provided for each plug connector 4 for connecting a peripheral 3. In the example, each plug connector 4 is connected to the corresponding further plug connector 5 using a direct connection. This design is a requirement of the specification used, in accordance with which the peripherals 3 and the control apparatus 6 interchange data. However, any desired other structures are, in principle, conceivable for the architecture of the connection from the control apparatus 6 to the plug connectors 4 via the further plug connectors 5. For example, it is possible for one further plug connector 5 to serve a plurality of plug connectors 4 in the form of a star or in a parallel manner. Although a point-to-point connection exists electrically, it is also conceivable for a plurality of the connecting lines of a plug connector 4 to be mechanically combined in a plug connector 5 (i.e., multiport connectors).

An optical signaling device 9 is assigned to each slot and thus to each plug connector 4. In the diagrammatic drawing shown in FIG. 1, these optical signaling devices are depicted on the backplane 1 for the sake of clarity. In one implementation of the exemplary embodiment, the optical signaling devices 9 are readily visible to an operator and clearly assigned to a push-in compartment. This can be achieved, for example, via optical waveguides in the form of small perspex rods which are incorporated in the push-in rack 2. Alternatively, it is possible to directly provide the optical signaling devices 9 (e.g., in the form of light-emitting diodes (LEDs)) in the push-in rack 2 on the side opposite the plug connectors 4 and to connect it to the backplane 1 using appropriate cables.

The function of the backplane 1 will be explained by way of example below with a backplane which is intended for use with a control apparatus 6 and peripherals 3 which are designed in accordance with either the SAS or the SATA specification. For this purpose, the plug connectors 4 and the further plug connectors 5 are first of all designed in accordance with the SAS specification, so that both SAS and SATA peripherals 3 and control apparatuses 6 can be mechanically connected. As already explained in the introduction, control apparatuses 6 which operate in accordance with the SAS specification can serve both SAS and SATA peripherals 3. It is thus necessary, for all possible combinations of types of control apparatus and peripherals, to detect the incompatible configuration of an SATA control apparatus 6 with an SAS peripheral 3 and to signal it to the user.

The monitoring device 10 is provided for this purpose, the device comprising the first detector 11 and the second detector 12 as well as the comparator 13. The task of the first detector 11 is to detect the types of connected peripherals 3. This type detection can take place in various ways.

In the exemplary embodiment shown, selected lines of each plug connector 4 are interrogated and are evaluated by the first detector 11. For example, the SAS specification for peripherals 3 provides for all of the data and ground lines to be duplicated (multiport) in order, for reasons of reliability, to change over to the second set of lines when the first set of lines (port) fails. The SATA specification does not provide this second set of lines, which is why the corresponding connections of the plug connector 4 are not connected via a SATA peripheral 3 according to the specification. This difference between an SAS peripheral and an SATA peripheral can be easily found via the first detector 11 performing an impedance measurement.

Another possibility would be to monitor the signal levels on the data lines which have different values for SAS and SATA peripherals 3 in accordance with the specifications. The first detector 1 transmits the results of the type detection to the comparator 13.

In an analogous manner to the first detector 11, the second detector 12 is configured to determine the type of control apparatus 6 which is connected to the respective peripheral 3. In this case too, the practice of monitoring the signal amplitudes or connecting particular lines is again a suitable method. Alternatively, it is also possible to use an identifier of the control apparatus 6, the identifier being transmitted with the data. Irrespective of the number of further plug connectors 5 (the latter could indeed serve a plurality of plug connectors 4 and thus peripherals 3) and irrespective of the actual number of connected control apparatuses 6, the second detector 12 determines the information relating to the type of control apparatus 6 separately for each slot and thus each peripheral 3 and transmits this information to the comparator 13. A pair of values of type information for each peripheral 3 which has been pushed in is thus available to the comparator 13. Each pair of values of type information is then examined for incompatible combinations, i.e., for the combination of an SATA control apparatus with an SAS peripheral in the example shown. Combinations which are not allowed are prescribed for the comparator 13 via, for example, tables which can be programmed in or switches or plug bridges or similar coding measures.

If the comparator 13 determines an incompatible type combination for one of the peripherals 3, it activates that optical signaling device 9 which is assigned to the slot in which the peripheral 3 which is not compatible with its control apparatus 6 is situated. The operator who has just pushed in this peripheral 3, for example, is made aware of the incompatibility in this manner and can take remedial action.

Mounting frames can include an optical signaling device for each push-in compartment, the signaling device being used, for example, to display the activity of a peripheral which has been pushed in. The optical signaling device 9 according to an exemplary embodiment can be combined with known optical devices by providing a multicolored display, for example, or by the warning message according to the invention, which indicates incompatibility, differing from other optical signals if desired (for example, by flashing or by flashing at a characteristic frequency or in a characteristic time sequence).

Figure 2:
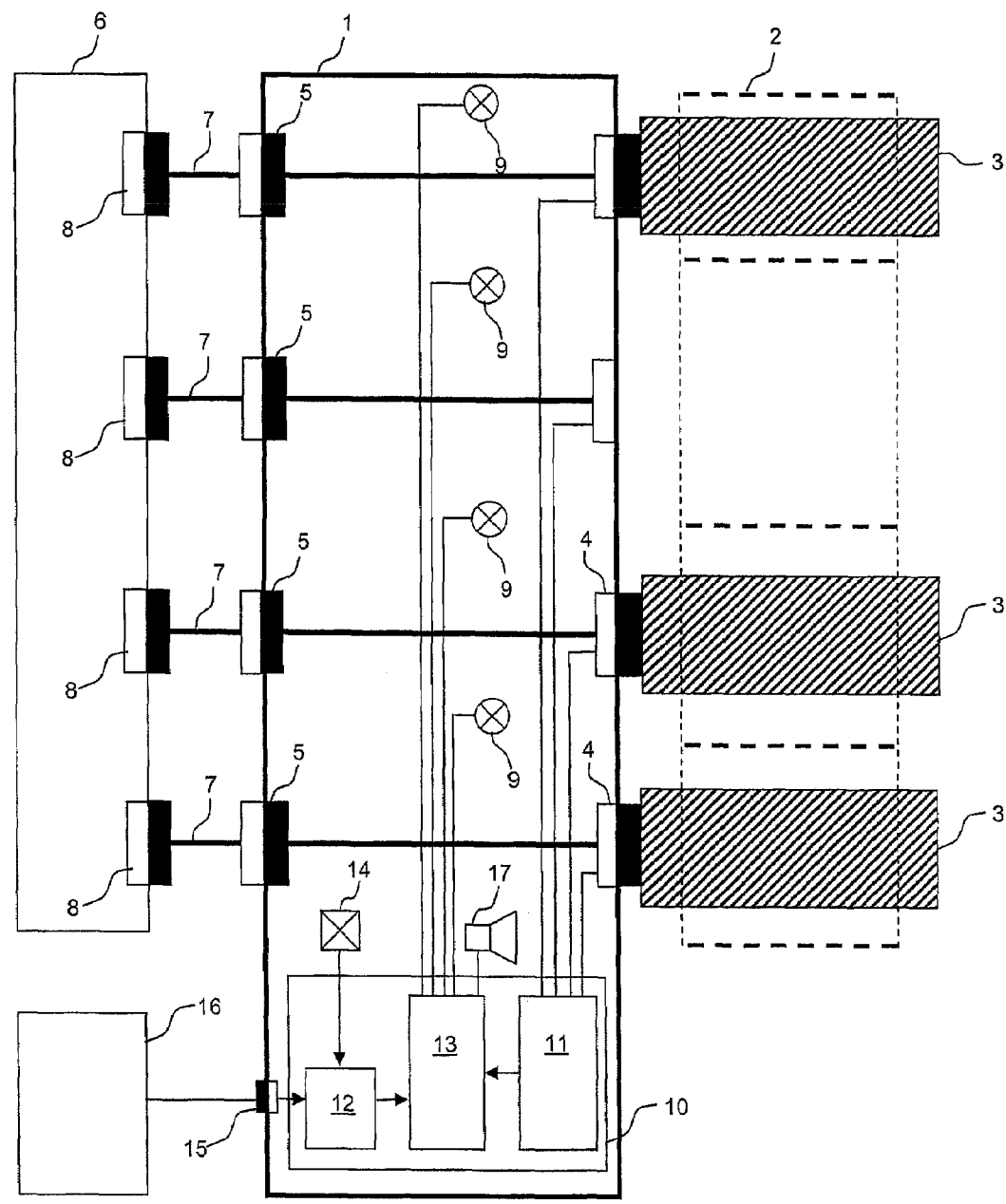
FIG. 2 shows a diagrammatic illustration of the data processing system including a second exemplary embodiment of the backplane.

The exemplary embodiment shown in FIG. 2 differs from the example illustrated in FIG. 1, in particular, in terms of the design of the second detector 12.

In this exemplary embodiment, the second detector 12 is not designed to detect the type of connected control apparatus 6 via the electrical signals from the control apparatus 6. Rather, the second detector 12 is informed of the type of control apparatus 6 via provided configuration information. For this purpose, provision is made of an interface 14 which connects the second detector 12 to a system control unit 15. Such a system control unit 15 is present in many computer systems. The control unit 15, inter alia, gathers information relating to the configuration of the system and provides the information in response to requests, for example, via the so-called system management bus. The second detector 12 can thus determine the type of control apparatus 6 in such a way and can forward this information to the comparator 13 as in the first exemplary embodiment.

Another possible way of determining configuration information is provided by a configuration element 16 which can be manually set. The configuration element 16 may be implemented, for example, using a DIL/DIP switch or an arrangement of jumpers on the backplane 1. In this case, the type of control apparatus 6 used must be manually input when connecting the control apparatus 6 to the backplane 1. Although this solution entails the risk of the configuration information being incorrect or not being brought up to date when the control apparatus 6 is exchanged, it can be implemented in a cost-effective manner.

Optionally, an acoustic warning apparatus 17 is provided, as shown in FIG. 2. The acoustic warning apparatus 17 is likewise activated when any of the optical signaling devices 9 is activated and thus boosts the indicating function of the signaling devices.

While the invention has been described in detail with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

What is claimed:

1. A backplane for use in a push-in rack for peripherals, the backplane comprising:
    at least one slot including plug connectors configured to connect with peripherals that are pushed into the push-in rack, wherein the slot plug connectors are configured to connect to at least two types of peripherals having different electrical signal properties;
    at least one optical signaling device, wherein each optical signaling device is assigned to a respective slot;
    at least one further plug connector configured to connect the backplane to at least one control apparatus, wherein the at least one further plug connector is configured to connect to at least two different types of control apparatuses having different electrical signal properties and the further plug connector being connected via the backplane to one or more of the slot plug connectors to facilitate interchanging of signals between the control apparatus and the peripherals pushed into the push-in rack; and
    a monitoring device comprising:
    a first detector operable to detect a type of each peripheral connected with a corresponding slot plug connector;
    a second detector configured to detect a type of control apparatus; and
    a comparator configured to compare the type of each peripheral detected by the first detector and the type of a respectively connected control apparatus detected by the second detector to predetermined type combinations so as to determine whether each peripheral is incompatible with the control apparatus, and the comparator is further configured to activate each optical signaling device assigned to a respective slot including a slot plug connector that is connected to a peripheral that has been determined to be incompatible with the control apparatus.

2. The backplane according to claim 1, wherein the first detector is operable to detect the type of each peripheral connected with the corresponding slot plug connector via the electrical properties or the protocol properties of signals generated by each peripheral.

3. The backplane according to claim 2, wherein the first detector detects the type of each peripheral via detection of a signal at the connection between each peripheral and the corresponding slot plug connector, where a connection is connected to ground in the event a corresponding peripheral is of the type operated with signals in accordance with SAS (Serial Attached SCSI) specification, and where a connection is not connected to ground in the event a corresponding peripheral is of the type operated with signals in accordance with SATA (Serial ATA) specification.

4. The backplane according to claim 2, wherein the first detector is configured to detect and evaluate signals that transmit data in accordance with SAS (Serial Attached SCSI) specification and with SATA (Serial ATA) specification, where the SAS specification and SATA specification have different amplitudes or protocol properties, and the first detector is further configured to detect the type of each peripheral via evaluation of the amplitudes or protocol properties of the signal at the connection between each peripheral and the corresponding slot plug connector.

5. The backplane according to claim 1, wherein the second detector is configured to detect the type of control apparatus via electrical properties or protocol properties of signals generated by the control apparatus.

6. The backplane according to claim 5, wherein the second detector is configured to detect the type of control apparatus via evaluation of an identifier transmitted by the control apparatus in signals detected at connections between slot plug connectors and corresponding peripherals.

7. The backplane according to claim 1, further comprising:
at least one configuration element configured to be manually set, wherein the second detector is configured to detect the type of control apparatus via the at least one configuration element.

8. The backplane according to claim 1, further comprising:
an interface configured to transmit configuration information to the backplane, wherein the second detector is configured to detect the type of control apparatus via the configuration information.

9. The backplane according to claim 1, wherein the peripherals and the at least one control apparatus are configured to be operated by processing signals in accordance with at least one of SATA (Serial ATA) specification and SAS (Serial Attached SCSI) specification.

10. The backplane according to claim 1, further comprising:
an acoustic warning device configured for activation in the event one of the optical signaling devices is activated.

11. A data processing apparatus, comprising:
a plurality of peripherals;
a push-in rack configured to hold the plurality of peripherals; and
a backplane according to claim 1.

* * * * *